United States Patent [19]
Amin

[11] Patent Number: 4,999,812
[45] Date of Patent: Mar. 12, 1991

[54] ARCHITECTURE FOR A FLASH ERASE EEPROM MEMORY

[75] Inventor: Alaaeldin Amin, Dhahran, Saudi Arabia

[73] Assignee: National Semiconductor Corp., Santa Clara, Calif.

[21] Appl. No.: 275,380

[22] Filed: Nov. 23, 1988

[51] Int. Cl.$^5$ .................... G11C 7/00; G11C 11/40
[52] U.S. Cl. .................... 365/185; 365/203; 357/23.5
[58] Field of Search ............... 365/185, 203; 357/23.5

[56] References Cited

U.S. PATENT DOCUMENTS

| | | | |
|---|---|---|---|
| 4,462,090 | 7/1984 | Iizuka | 365/185 |
| 4,852,062 | 7/1989 | Baker et al. | 365/185 |

*Primary Examiner*—James W. Moffitt
*Attorney, Agent, or Firm*—Steven F. Caserza; Lee Patch

[57] ABSTRACT

An EEPROM device provides increased speed and less susceptibility to soft writes during reading and programming operations. A unique circuit design and operating method obviates the need for applying a high programming or erase voltage in the path between the memory array and sense amplifier. Such high programming and erase voltages are applied, as needed, directly to the memory array, thereby allowing all transistors which carry signals from the memory array to the sense amplifier to be fabricated as low voltage devices, thereby increasing their speed of operation and thus the speed of operation of the memory device as a whole. By applying the relatively high programming and erase voltages to the source of the memory transistors, and reading from the drain of the memory transistors, the source and drain as well as associated circuitry are fabricated to optimize their intended functions.

21 Claims, 4 Drawing Sheets

ARCHITECTURE FOR A FLASH ERASE EEPROM MEMORY

FIELD OF THE INVENTION

This invention pertains to memory devices and more particularly to flash erase EEPROM memories.

BACKGROUND OF THE INVENTION

Electrically erasable programmable read only memories (EEPROMs) are well known in the art. EEPROMs, like other memory devices, include a plurality of memory cells, each capable of storing a single binary digit (bit). The binary value stored in each cell is programmed to a logical zero or logical one value by placing an appropriate charge on the floating gate of a MOS transistor forming the cell. By altering the charge stored on the floating gate, the threshold voltage required to be applied to the control gate of the floating gate transistor is changed to either a voltage level representing a logical one or a voltage level representing a logical zero. When the memory cell is accessed for reading, a voltage is applied to the control gate which is greater than the threshold voltage associated with a logical one but less than the threshold voltage associated with a logical zero. In this manner, with a read signal applied to the control gate, the floating gate transistor turns on if it stores a logical one, but remains off if it stores a logical zero. A sense amplifier, well known in the art, is used to determine if the transistor is on or off.

FIG. 1 is a schematic diagram of a typical prior art EEPROM. The circuit of FIG. 1 allows for flash erasure of all bits stored in the memory array, that is to say the cells are written on a bit-by-bit, or word-by-word basis, the array is read on a word-by-word basis, and the array is erased by erasing all cells simultaneously to the logical one state. As shown in FIG. 1, flash erase EEPROM circuit 100 includes a plurality of row lines 101-1 through 101 N, and a plurality of columns or "bit lines" 102-1 through 102-M. Associated with each combination of row line and bit line is one of floating gate memory cell transistors 105-1-1 through 105-N-M. The control gates of each memory cell transistor 105-1-1 through 105-N-M are connected to their associated row lines 101-1 through 101-N. The drains of each memory cell transistor are connected to their associated bit lines. The sources of each memory cell transistor are connected in common to the drain of erase transistor 112, as is more fully described later.

Power is supplied to each bit line 102-1 through 102-M through column select transistors 104-1 through 104-M, each receiving an appropriate column select signal on their gate leads 103-1 through 103-M, respectively. The entire block of array transistors 105-1-1 through 105-N-M is selected by block transistor 106 receiving a block select signal (for example, a decoded signal based on one or more most significant address bits, with the least significant address bits defining individual memory cells within the block) applied to its gate lead 107. When block select transistor 106 is turned on, the block containing memory cells 105-1-1 through 105-N-M is selected and when one or more column select transistors 104-1 through 104-M are turned on, desired ones of bit lines 102-1 through 102-M are selected. This enables the appropriate voltages to be applied to desired ones of bit lines of 102-1 through 102-M.

For example, a programming voltage VPP (typically 12 volts during programming and 17 volts during erasure) is selectively applied to selected bit lines when programming/erase control circuitry 119 provides a signal to the gate of programming/erase transistor 108 causing transistor 108 to conduct. Similarly, during the read operation, the voltage level of a selected bit line is applied via transistor 110 to sense amplifier 111 in order to determine the value of the bit stored in a selected memory cell.

The operation of circuit 100 in the programming, reading, and erasure modes is depicted in Table 1. During programming, memory array transistors are written individually by selectively addressing desired rows and columns. Thus, a selected row receives a voltage (typically approximately 14 volts) thereby enabling the memory transistors within the row to turn on. At the same time, deselected rows each receive a logical zero, preventing the memory transistors of the deselected rows from turning on. For those memory cells within the selected row which are to store a logical one (floating gate uncharged, relatively low control gate threshold voltage), their associated bit lines receive a logical zero by causing their associated column select transistors 104-1 through 104-M to remain off. In other words, columns whose memory cells are to store a logical one are deselected. Conversely, columns associated with memory cells which are to store a logical zero are selected by turning on their associated column select transistors 104-1 through 104-M, and programming/erase control circuitry 119 causes transistor 108 to turn on, thereby applying programming voltage VPP to the selected columns. This action causes the memory transistors which are to store a logical one to turn on and, with a relatively high voltage VPP applied to their drains, 0 volts on their sources, and a high voltage (typically 14 volts) applied to the control gate, cause hot electrons to be injected from the drain to the floating gate, thereby increasing the control gate threshold voltage to that threshold voltage associated with a logical zero.

During reading of circuit 100, individual memory cells are selected by an appropriate combination of column select and row select signals, allowing the data stored in the selected memory cell to be detected by sense amplifier 111. Thus, for example, to read the data stored in memory cell 105-1-1, row line 101-1 is selected by applying voltage VCC of approximately 5 volts with row lines 101-2 through 101-N being deselected by applying zero volts. Bit line 102-1 is selected by causing column select transistor 104-1 to turn on, while deselecting bit lines 102-2 through 102-M by causing column select transistors 104-2 through 104-M to be turned off. During the read operation, programming/erase transistor 108 is turned off, and a reference voltage VREF (typically 2.5 volts) is applied to the gate of pass transistor 110. This causes the voltage on the selected bit line 102-1 to be applied to the input lead of sense amplifier 111, which in turn provides an output signal indicating whether the selected memory cell 105-1-1 stores a logical zero or a logical one.

When memory cell 105-1-1 stores a logical one, its control gate threshold voltage is less than the read voltage applied to row line 101-1, and thus memory cell transistor 105-1-1 is turned on pulling the input lead of sense amplifier 111 low through transistors 110, 106, 104-1, 105-1-1, and 112. Conversely, when memory cell 105-1-1 stores a logical zero, its control gate threshold voltage is greater than the read voltage applied to row line 101-1, memory cell transistor 105-1-1 does not turn on, and the input lead of sense amplifier 111 is not pulled low. Thus, sense amplifier 111 can detect the two possible values of the bits stored by the memory selected for reading.

During erasure, memory cells 105-1-1 through 105-N-M are "flash" erased, i.e., all erased simultaneously such that they store logical zeros. This is accomplished by applying 0 volts to the row lines connected to the control gates of the memory transistors, a high voltage (typically 17 volts) to the bit lines connected to the drains of the memory cell transistors, and leaving the erase line, which is connected to the sources of the memory cell transistors, floating.

Of importance, during programming and erasing of memory cells 105-1-1 through 105-N-M, a relatively high voltage VPP is applied to selected bit lines 102-1 through 102-M. This requires all transistors between VPP terminal 120 and bit lines 102-1 through 102-M, as well as transistor 110 located between VPP terminal 120 and the input lead of sense amplifier 111, to be fabricated to ensure they will not break down due to the use of the relatively high voltage VPP. MOS transistors utilized in this fashion, when subjected to relatively high voltages, are subject to gated diode breakdown which, of course, must be eliminated if the device is to operate properly and be reliable over a long period of time. A gated diode is a PN junction located under the gate electrode. When the gate electrode is grounded, the breakdown voltage of the gated diode is much lower than the breakdown voltage of the gated diode when the gate is not grounded. Furthermore, the gated diode breakdown voltage is lower with thinner gate oxides and shallower junctions depths. In order to prevent such gated diode breakdown problems, these transistors are typically formed utilizing a relatively thick gate oxide (typically 350 Å thick) as compared with the relatively thin gate oxide utilized by the peripheral transistors in the speed path, such as the transistors (not shown) of sense amplifier 111, and the transistors of the address buffers, also not shown, which typically have gate oxide thicknesses on the order of 250 Å. While the use of thick gate oxide satisfies the requirement that these transistors be impervious to breakdown problems when a high programming/erasure voltage VPP is applied, it has a deleterious effect of decreasing the gain of these transistors, which in turn decreases their switching speed. A decreased switching speed of any transistors located between sense amplifier 111 and the memory array transistors 105-1-1 through 105-N-M decreases the speed of operation of the device, clearly an undesirable feature.

FIG. 2 is a top view of a pair of typical prior art EEPROM memory cells including N+ drain diffusion 201, which is connected via electrical contact 202 to metallization layer 203. Cell 200 also includes a first layer of polycrystalline silicon 204 which serves as the floating gate of the EEPROM memory transistor, and a second layer of polycrystalline silicon 205 which serves as the control gate and which forms part of a row line. As described above with regard to the schematic diagram of FIG. 1, programming, reading, and erasure of cell 200 is all performed from the drain 201 side of the memory cell.

SUMMARY OF THE INVENTION

In accordance with the teachings of this invention, speed of an EEPROM device is enhanced by utilizing a unique circuit design and operating method which obviates the need for applying a high programming or erase voltage in the path between the memory array and sense amplifier. In accordance with the teachings of this invention, such high programming and erase voltages are applied, as needed, directly to the memory array, thereby allowing all transistors which carry signals from the memory array to the sense amplifier to be fabricated as low voltage devices, thereby increasing their speed of operation and thus the speed of operation of the memory device as a whole. By applying the relatively high programming and erase voltages to the source of the memory transistors, and reading from the drain of the memory transistors, the source and drain, as well as associated circuitry, are fabricated to optimize their intended functions.

These and other features and advantages of the invention will be more readily apparent upon reading the following description of a preferred exemplified embodiment of the invention and upon reference to the accompanying drawings wherein:

DETAILED DESCRIPTION

Figure 3:
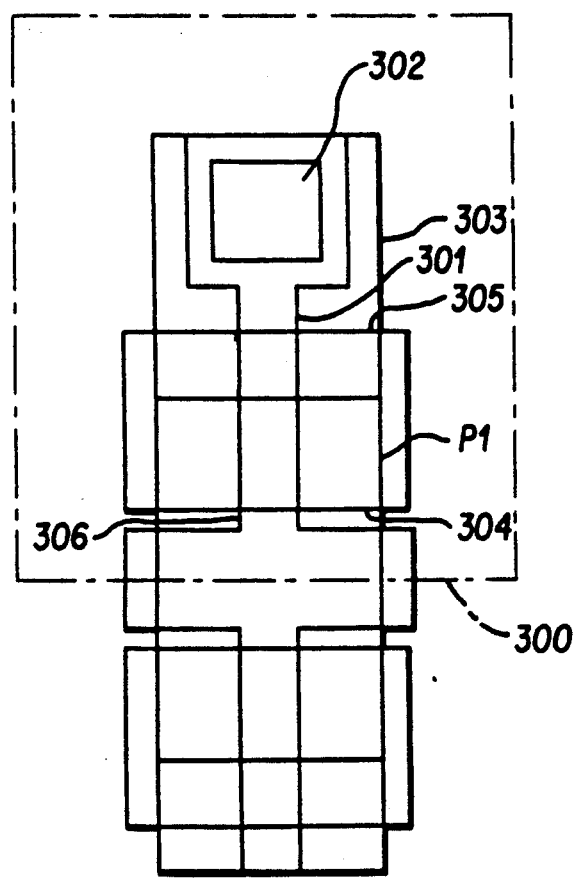
FIG. 3 is a plan view of an EEPROM cell constructed in accordance with the teachings of this invention.
Figure 2:
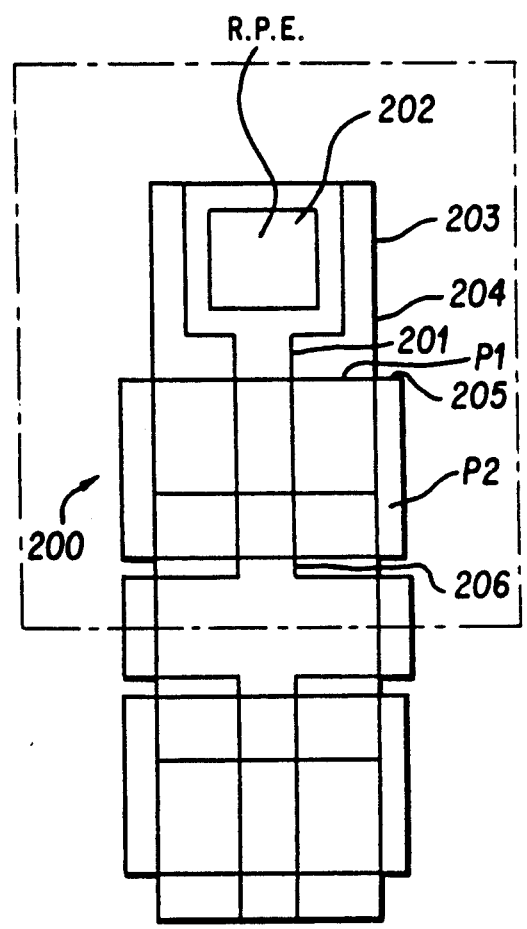
FIG. 2 is a plan view of a typical prior art EEPROM cell.
Figure 4:
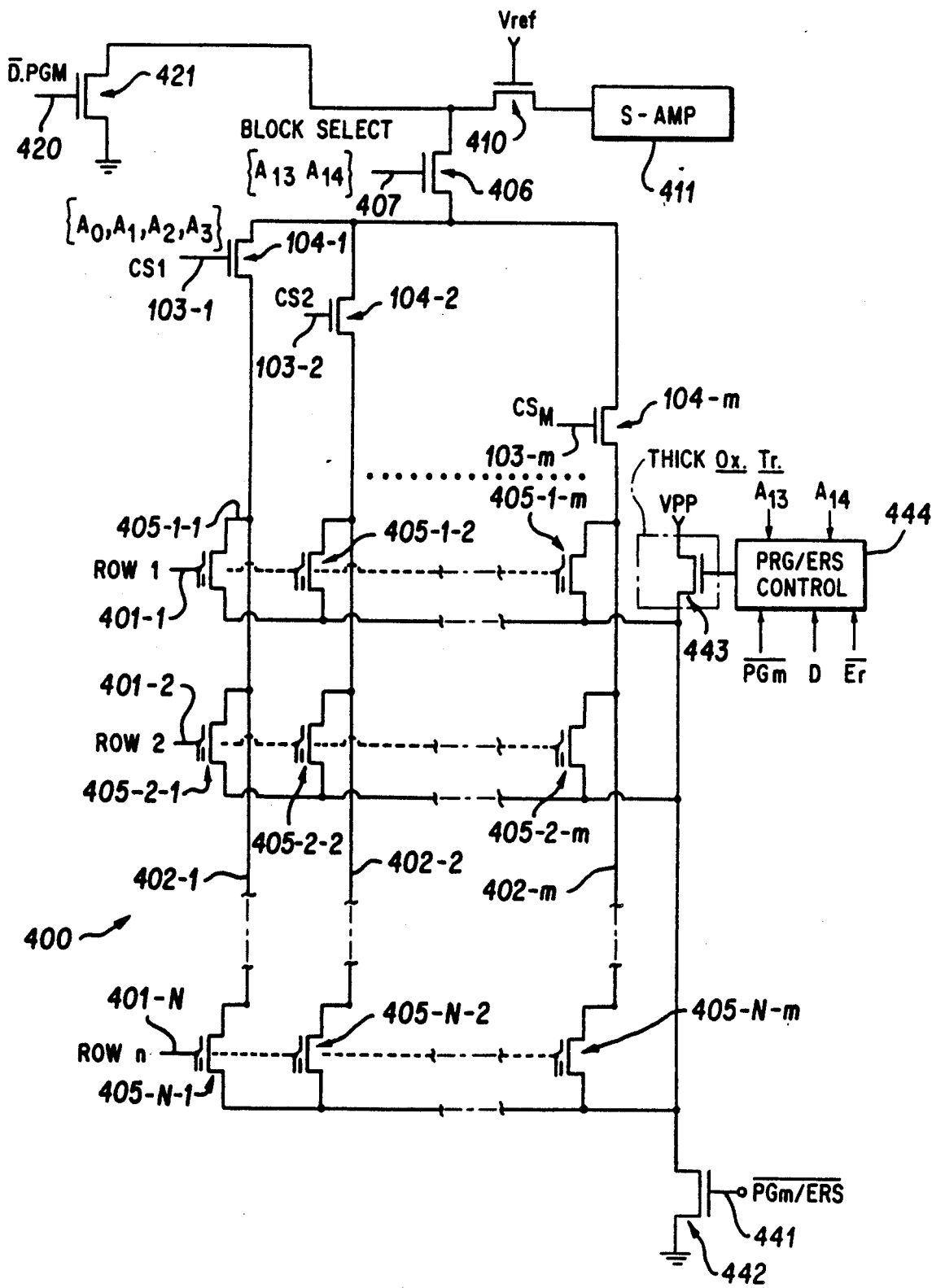
FIG. 4 is a schematic diagram of one embodiment of a flash erase EEPROM constructed in accordance with the teaching of this invention.

FIG. 4 is a schematic diagram of one embodiment of a memory device 400 constructed in accordance with the teachings of this invention. FIG. 3 is a plan view of a pair of EEPROM memory cells constructed in accordance with the teachings of this invention in which a first layer P1 of polycrystalline silicon forms floating gate 304 located near source 306, rather than near drain 301. In this embodiment, reading is performed from the drain 301 side of memory cell 300, and programming and erasing performed from the source 306 side of memory cell 300.

Figure 1:
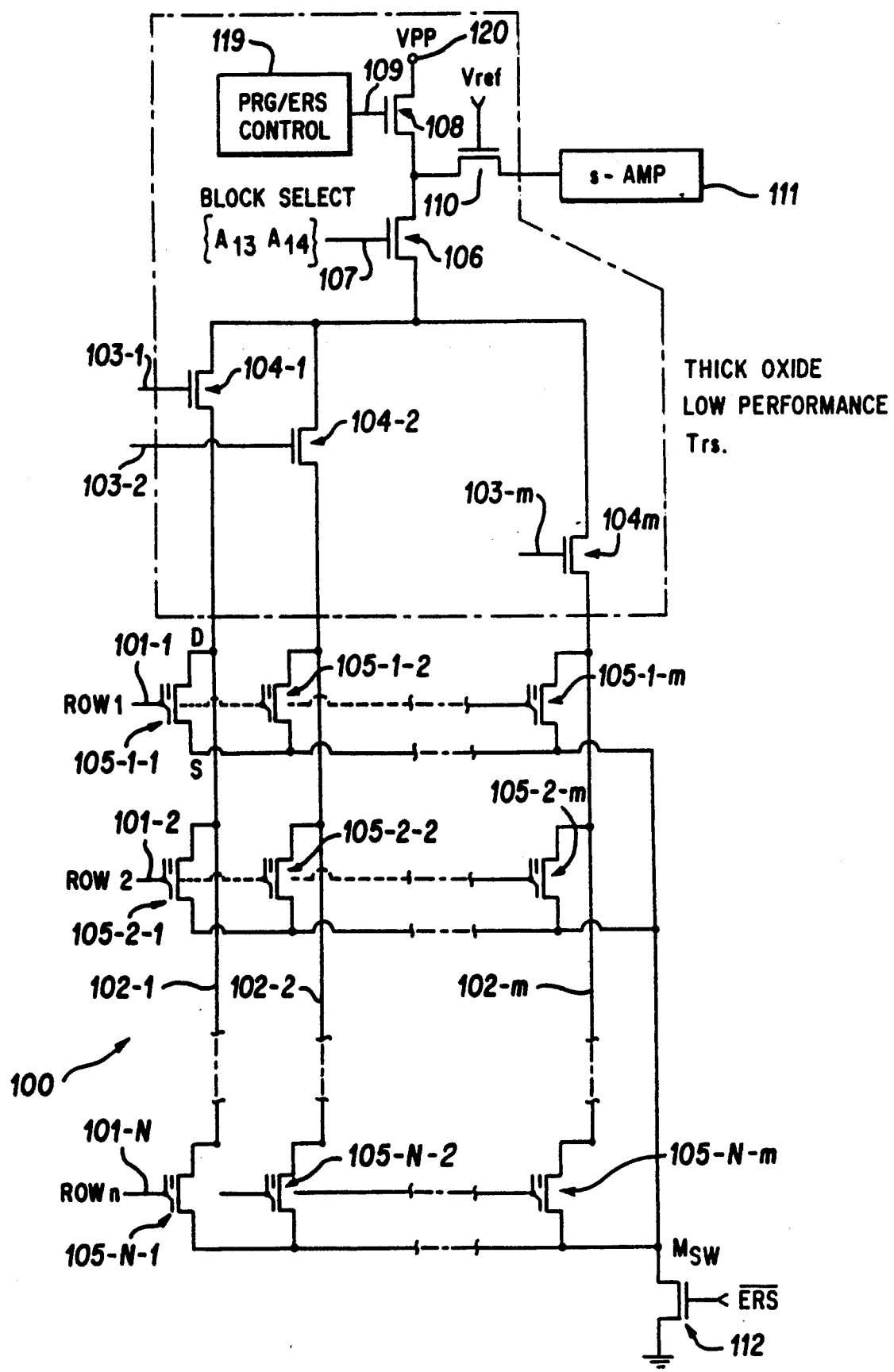
FIG. 1 is a schematic diagram of a typical prior art flash erase EEPROM device.

Referring now to FIG. 4, memory device 400 includes row lines 401-1 through 401-N, bit lines 402-1 through 402-M, column select transistors 104-1 through 104-M, and memory array transistors 405-1-1 through 405-N-M. Block select transistor 406 is utilized to access the block of memory cells 405-1-1 through 405-N-M. In contrast to the prior art, as depicted in FIG. 1, memory cell transistors 405-1-1 through 405-N-M are fabricated such that their floating gates are located near their sources, rather than near their drains. This allows high programming and erase voltages to be applied to the sources of memory array transistors 405-1-1 through 405-N-M, thereby precluding the application of high programming/erase voltage VPP from block select transistor 406 and column select transistors 104-1 through 104-M and pass transistor 410. Therefore these transistors located between bit lines 402-1 and 402-M and sense amplifier 411 need not be fabricated to ensure a high breakdown voltage; thus these transistors can be fabricated utilizing a relatively thin (typically approximately 250 Å) gate oxide ensuring high gain and fast switching speed.

It is desirable to increase the read current through a selected memory cell during the read operation in order to provide faster speed of operation and a greater noise immunity. The read current is dependent on the drain saturation voltage $V_{DSAT}$, which is defined as:

$$V_{DSAT} = V_{GS} - V_T,$$

where:
$V_{DSAT}$ = the drain saturation voltage;
$V_{GS}$ = the gate-to-source voltage; and
$V_T$ = the threshold voltage.

In prior art devices, where the floating gate is located near the drain, the read current is limited by the floating gate voltage, which is typically 60 to 70% of the control gate voltage. However, in accordance with the teachings of this invention, by placing the floating gate close to the source rather than the drain as in the prior art, the read current through the selected memory cell during the read operation is increased since the saturation voltage $V_{DSAT}$ is increased since the drain is influenced by the control gate voltage, rather than the lesser floating gate voltage. By increasing the read current, reading speed is increased. It has been determined that placing the floating gate near the source rather than near the drain increases the read current by about 10 to 15 percent.

In accordance with the teachings of this invention, increased speed is also provided due to the fact that column read voltages may be increased, thereby additionally providing increased read current through a selected array transistor, without risking undesirable "soft" writes of the memory cell being read, since the higher read voltage is applied to the drain which is not located near the floating gate. As is well known, over a large number of read cycles, undesirable charging may cause a cumulative charge to be placed on the floating gate of a deselected transistor, thereby causing a "soft" write.

Furthermore, utilizing the memory array transistors of this invention, more P+ (e.g., Boron) ion implants need not be made to the drains of the memory array transistors as is often the case in prior art structures for enhancing the ability to program the cell, since having a P+N+ junction rather than a P-N+ junction increases the maximum field at the junction leading to greater hot electron generation. However, such ion implants can be used on the source side of the memory array transistors where, in accordance with the teachings of this invention, programming occurs by charging the floating gate. By avoiding ion implants on the drains of the memory array transistors, bit line capacitance is reduced, thereby increasing reading speed.

In one embodiment of this invention, the P type field implant is not performed near the source of the memory cell transistors, thus increasing the gated diode breakdown voltage of the source junction, which in turn allows greater voltages to be applied to the source in order to improve the performance of the Fowler Nordheim electron tunneling between the source and the floating gate, as well as decreasing susceptibility of the junction to breakdown. As is well known, Fowler Nordheim tunneling is independent of temperature and is effective only at high electric fields (typically 7 to 10 Megavolts per centimeter). Such a pull back of the field implant in order to improve Fowler Nordheim tunneling from the drains was not possible in the prior art since the pull back of the field implant would have to be performed around the drains of the memory array transistors, which would undesirably degrade the isolation between bit lines and have a deleterious effect on the ability to program memory array transistors due to increased leakage currents leading to lower programming currents.

Programming of a selected memory array transistor is performed by applying programming voltage VPP to a selected row line while holding deselected row lines at zero volts, and applying programming voltage VPP through transistor 443 to the sources of all memory array transistors. A selected column is grounded by turning on its associated column select transistor, and block select transistor 406 and transistor 421. This causes electrons to be tunneled from the source to the floating gate of the selected transistor.

Figure 5:
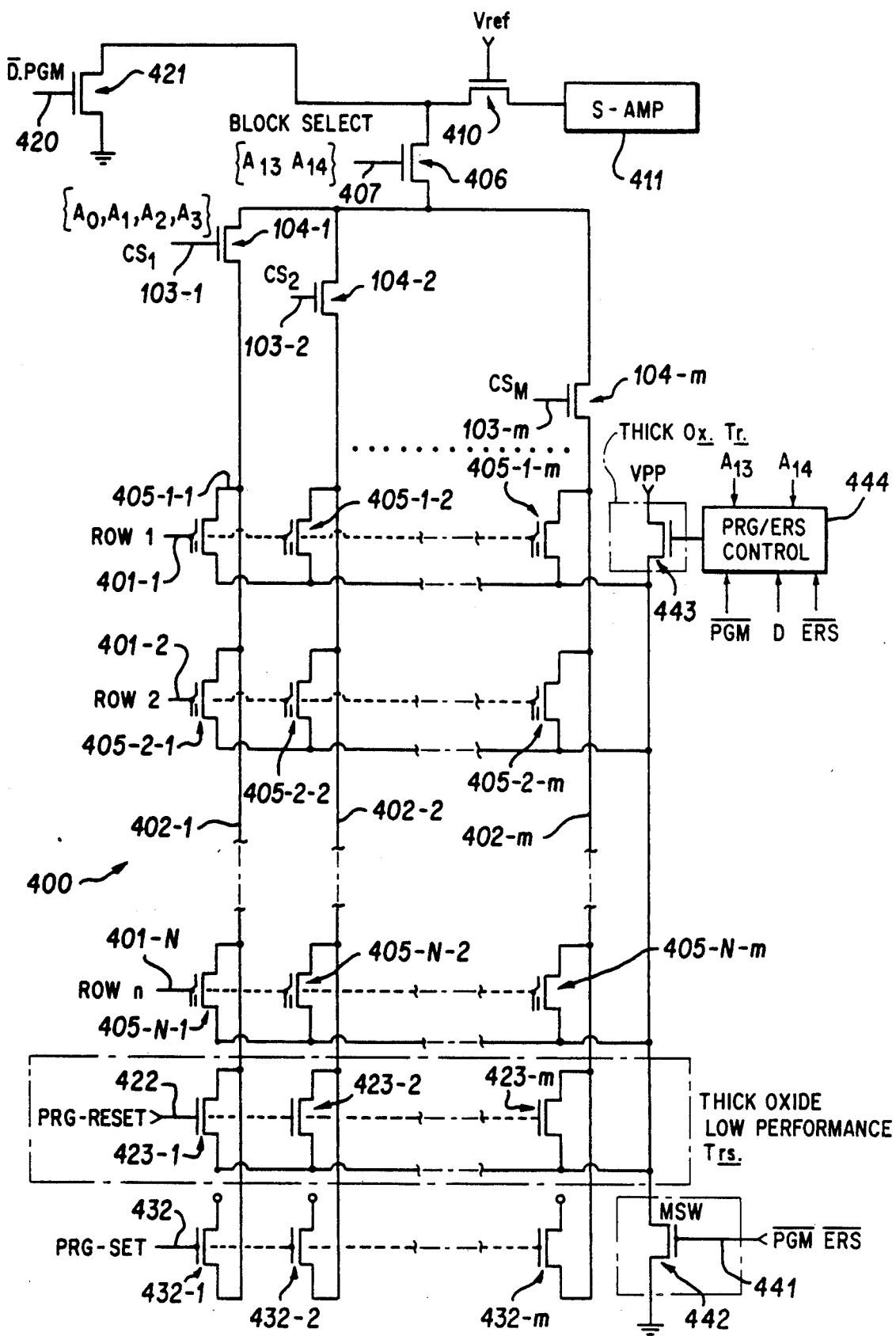
FIG. 5 is a schematic diagram of another embodiment of a flash erase EEPROM constructed in accordance with the teachings of this invention.

In the embodiment of FIG. 5, programming set transistors 432-1 through 432-M and programming reset transistors 423-1 through 423-M are utilized to minimize the potential for soft programming cells along the selected row line but along deselected columns, which are left floating and thus may be undesirably charged by current flowing from its source to its drain.

In the embodiment of FIG. 5, such soft writing is avoided by precharging the deselected bit lines, thereby preventing current from flowing through deselected memory array transistors, which in turn prevents any amount of charging of the floating gates of deselected transistors during the programming of a selected memory array transistor. In the embodiment of FIG. 5, programming a selected memory array cell, for example transistor 405-1-1, is performed by first applying a PRGSET signal to lead 432, thus turning on precharge transistors 432-1 through 432-M which apply a predefined voltage (for example, 10 volts) to bit lines 402-1 through 402-M, respectively. The PRGSET signal then goes low, turning off transistors 432-1 through 432-M while leaving bit lines 402-1 through 402-M precharged. Transistor 421 is then turned on, thereby causing selected bit line 402-1 to be discharged through conducting column select transistor 104-1 and block select transistor 406. The deselected columns 402-2 through 402-M remain precharged since their column select transistors 104-2 through 104-M are turned off. Source pull down transistor 442 is turned off, and programming voltage VPP is applied through transistor 443 to the sources of all memory array transistors 405-1-1 through 405-N-M. Selected memory array transistor 405-1-1 conducts current from its source to its drain, thereby placing a charge on its floating gate. However, the remaining, deselected memory array transistors do not conduct current since their drains are connected to precharged bit lines 402-2 through 402-M, thereby preventing any charge from being introduced to their floating gates and preventing soft write errors. When memory array transistor 405-1-1 has been programmed, transistor 443 is turned off and transistor 442 is turned on, thereby connecting the sources of memory array transistors 405-1-1 through 405-N-M to be connected to ground. Bit lines 402-2 through 402-M are discharged by applying a PRG reset signal to lead 422, thus turning on reset transistors 423-1 through 423 M. In an alternative embodiment, reset transistors 423-1 through 423-M are not used, and the bit lines are discharged by enabling all column select transistors 104-1 through 104-M while transistor 421 is turned on.

Although the foregoing invention has been described in some detail by way of illustration and example for purposes of clarity of understanding, it will be readily apparent to those of ordinary skill in the art in light of the teachings of this application that certain changes and modifications may be practiced within the scope of the appended claims.

TABLE 1

| Programming | | |
|---|---|---|
| Row line (control gate) | selected: | 14 volts |
| | deselected: | 0 volts |
| bit line (drain) | logical 1: | 0 volts (column deselected) |
| | logical 0: | VPP = 9 volts (column selected) |
| erase line (source): | | 0 volts |
| Reading | | |
| Row line (control gate) | selected: | VCC (5 volts) |
| | deselected: | 0 volts |
| bit line (drain) | precharged to $V_{ref}$-$V_T$ (typically 1.5 volts) | |
| | logical 0 stored: | pulled low by array transistor, by at least 0.2 volts from precharged level |
| | logical 0 stored: | not pulled low by array transistor |
| erase line (source): | | 0 volts |
| Erasure | | |
| Row line (control gate): | | 0 volts |
| bit line (drain): | | 17 volts |
| erase line (source): | | Floating |

TABLE 2

| Programming | | |
|---|---|---|
| Row line (control gate) | selected: | VPP = 14 volts |
| | deselected: | 0 volts |
| bit line (drain) | logical 0: | |
| | selected: | approximately 0 volts |
| | deselected: | approximately 9 volts volts |
| | logical 1: | 0 volts |
| erase line (source): | | VSP = 9 volts |
| Reading | | |
| Row line (control gate) | selected: | VCC (5 volts) |
| | deselected: | 0 |
| bit line (drain) | logical 0 stored: | 2 volts |
| | logical 1 stored: | 1.8 volts |
| erase line (source): | | 0 |
| Erasure | | |
| Row line (control gate): | | 0 volts |
| bit line (drain): | | Floating |
| erase line (source): | | VEE = 17 volts |

I claim:

1. A memory device comprising:
a memory cell comprising:
  a source region;
  a drain region located apart from said source region;
  a channel region located between said source and said drain regions;
  a floating gate electrode above and insulated from said channel region sufficiently close to said source region to allow charge transfer between said floating gate electrode and that portion of said channel region adjacent said source region, and sufficiently distant from said drain region to prevent charge transfer between said floating gate electrode and that portion of said channel region adjacent said drain region; and
  a control gate electrode located above said channel region and said floating gate electrode and insulated from said channel region and said floating gate electrode;
programming means connected to said source region for selectively causing a change in the charge stored on said floating gate electrode, thereby altering the control gate threshold voltage of said memory cell; and
reading means connected to said drain region for determining the amount of current flow through said channel region in response to the application of a set of read voltages to said control gate electrode, source region, and drain region.

2. A structure as in claim 1 wherein said source region is doped to a sufficient high doping level to increase hot electron injection from that portion of said channel region near said source region to said floating gate during programming.

3. A structure as in claims 1 or 2 wherein said drain region is doped to a sufficiently low doping level to reduce parasitic drain capacitance.

4. A structure as in claim 1 wherein said reading means comprises transistors having breakdown voltages less than the programming voltage applied by said programming means to said source region during programming.

5. A structure as in claim 1 which further comprises a source field region adjacent at least a portion of said source region not adjacent said channel region, said source field region being not heavily doped, thereby increasing the gated diode breakdown voltage of said region.

6. A structure as in claims 1 or 5 which further comprises a drain field region adjacent at least a portion of said drain region not adjacent said channel region, said drain field region being relatively highly doped, thereby increasing the isolation of said drain region.

7. A structure as in claim 1 wherein said programming means serves to add electrons to said floating gate electrode, thereby altering the control gate threshold voltage of said memory transistor in a first direction, and also serves to remove electrons from said floating gate electrode, thereby altering the control gate threshold voltage of said memory transistor in a second direction opposite said first direction.

8. A memory device comprising:
a plurality of bit lines;
a plurality of word lines;
bit line addressing means for selecting a desired one of said bit lines and deselecting the remaining bit lines;
word line addressing means for selecting a desired one of said word lines and deselecting the remaining word lines;
a plurality of memory cells, each uniquely associated with a bit line-word line pair, each said memory cell comprising:
  a source region;
  a drain region located apart from said source region and connected to the bit line associated with said memory cell;
  a channel region located between said source and said drain regions;

a floating gate electrode located above said channel region near said source region and not near said drain region, said floating gate electrode separated from said channel by a first dielectric layer;

a control gate electrode located above said channel region and said floating gate electrode and separated from said channel region and said floating gate electrode by a second dielectric layer, said control gate electrode being connected to the word line associated with said memory cell;

programming means for applying a programming potential between said source region and said word line of a selected memory cell in order to selectively cause a change in the charge stored on said floating gate electrode of said selected memory cell, thereby altering the control gate threshold voltage of said selected memory cell; and a sense amplifier having an input lead connected to said selected bit line and having an output lead for providing an output signal indicative of the data stored in said selected memory cell.

9. A structure as in claim 8 wherein said source region is doped to a sufficiently high doping level to increase hot electron injection from that portion of said channel region near said source region to said floating gate during programming.

10. A structure as in claims 8 or 9 wherein said drain region is doped to a sufficiently low doping level to reduce parasitic drain capacitance.

11. A structure as in claim 8 wherein said bit line addressing means comprises transistors having breakdown voltages less than the programming voltage applied by said programming means to said source region during programming.

12. A structure as in claim 8 which further comprises a source field region adjacent at least a portion of said source region not adjacent said channel region, said source field region being not heavily doped, thereby increasing the gated diode breakdown voltage of said source region.

13. A structure as in claims 8 or 12 which further comprises a drain field region adjacent at least a portion of said drain region not adjacent said channel region, said drain field region being relatively highly doped, thereby increasing the isolation of said drain regions.

14. A structure as in claim 13 wherein said drain field region serves to provide isolation between adjacent drain regions.

15. A structure as in claim 8 wherein said programming means serves to add electrons to said floating gate electrode, thereby altering the control gate threshold voltage of said memory transistor in a first direction, and also serves to remove electrons from said floating gate electrode, thereby altering the control gate threshold voltage of said memory transistor in a second direction opposite said first direction.

16. A structure as in claim 8 further comprising means for precharging said bit lines prior to addressing a selected one of said bit lines for programming a desired one of said memory cells associated with said selected bit line.

17. A structure as in claim 16 wherein said means for precharging comprises:

a precharge source for providing a precharge potential; and a plurality of precharge transistors, each uniquely associated with one of said bit lines, and having a source connected to said bit line, a drain connected to said precharge source, and a control gate connected to means for providing a precharge control signal.

18. A structure as in claim 16 further comprising means for discharging said selected bit line for programming while leaving all remaining bit lines precharged.

19. A structure as in claim 18 wherein said means for discharging comprises a transistor having a source connected to said drains of said plurality of precharge transistors, a drain connected to a discharge potential, and a control gate connected to receive a discharge signal.

20. A structure as in claim 17 wherein said precharge transistors have a breakdown voltage greater than said programming potential.

21. A structure as in claims 18 or 19 wherein said means for discharging comprises transistors having breakdown voltages greater than said programming potential.

* * * * *